United States Patent [19]

Martheli

[11] Patent Number: 4,990,866
[45] Date of Patent: Feb. 5, 1991

[54] VOLTAGE CONTROLLED MICROWAVE OSCILLATOR USING A VARACTOR AS INDUCTANCE

[75] Inventor: Michel Martheli, Jouy le Moutier, France

[73] Assignee: Alcatel N.V., Amsterdam, Netherlands

[21] Appl. No.: 494,211

[22] Filed: Mar. 14, 1990

[30] Foreign Application Priority Data

Mar. 15, 1989 [FR] France .................. 89 03412

[51] Int. Cl.$^5$ .................. H03B 5/12; H03B 5/18
[52] U.S. Cl. .................. 331/99; 331/117 D; 331/177 V; 331/181
[58] Field of Search .......... 331/36 C, 96, 99, 107 SL, 331/117 D, 177 V, 36 L, 181

[56] References Cited

U.S. PATENT DOCUMENTS

| | | | |
|---|---|---|---|
| 4,598,423 | 7/1986 | Hettiger | 455/191 |
| 4,684,904 | 8/1987 | Watkins et al. | 331/117 R |
| 4,736,169 | 4/1988 | Weaver et al. | 331/117 R |

FOREIGN PATENT DOCUMENTS 2494929  5/1982  France .

OTHER PUBLICATIONS

Schaffner, "Put the Varactor's Inductance to Use", Electronic Design, vol. 21, Oct. 11, 1967, pp. 78–82.
Microwave Journal, vol. 30, No. 5, May 1987, pp. 347–348, 350, 352–353, Norwood, Mass., US; J. Kitchen: "Octove Bandwidth Varactor-Tuned Oscillators", (p. 47, paragraph: Varactor Diodes.

Primary Examiner—Siegfried H. Grimm
Attorney, Agent, or Firm—Christie, Parker & Hale

[57] ABSTRACT

A tuning circuit (4) for a VCO includes a coarse tuning section (6) and a fine tuning section (7). The coarse tuning section includes three varactors (13, 14, 15) connected in series. These varactors together with their housings are designed to operate at considerably lower frequencies than the VCO, so that they behave as inductances at the VCO frequency. A capacitance (16) connected in parallel with the varactor inductances forms a resonant circuit therewith and serves to widen the tuning band of the VCO in adjustable manner. A capacitance (17) connected between the coarse and fine tuning sections adjusts the central oscillation frequency. An adjustable transmission line (12) in the fine tuning section adjusts fine tuning sensitivity.

6 Claims, 1 Drawing Sheet

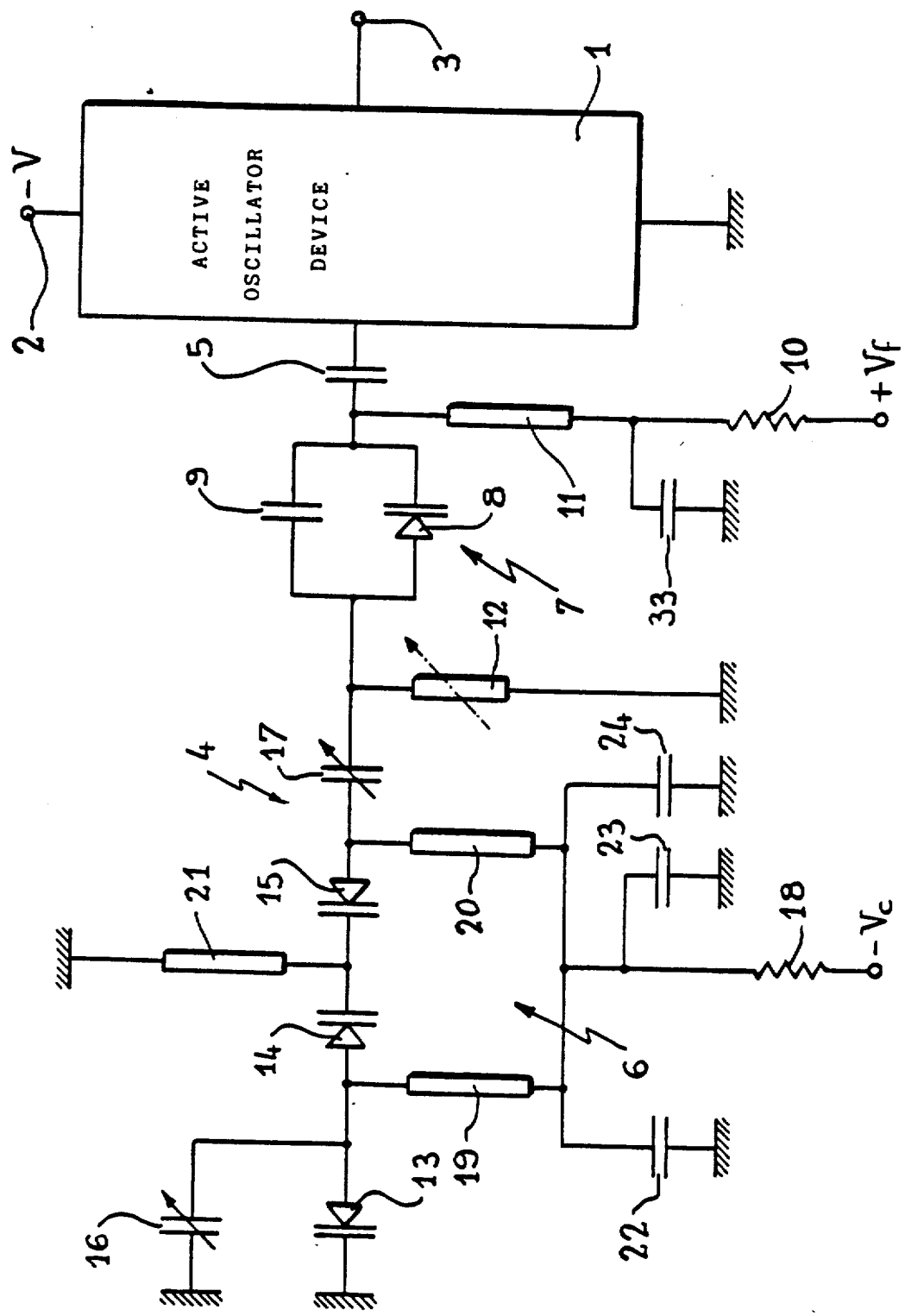

VOLTAGE CONTROLLED MICROWAVE OSCILLATOR USING A VARACTOR AS INDUCTANCE

The present invention relates to a voltage controlled microwave oscillator commonly referred to by the abbreviation VCO.

A microwave VCO is a microwave oscillator whose oscillation frequency is controllable by means of a voltage. The state of the art may be illustrated, for example, by Documents U.S. Pat. No. 4,736,169 and U.S. Pat. No. 4,684,904, both of which relate to two-slope VCOs, each having two distinct voltage control accesses:

one access for steep slope control, i.e. for coarse tuning; and another access for gentle slope control, i.e. for fine tuning.

However, the invention is applicable to VCOs in general, regardless of whether they have two tuning slopes or not.

Although presently known VCOs, such as that described in above-mentioned Document U.S. Pat. No. 4,684,904 for example, may have good spectrum quality, they suffer from the drawback of being incapable of sweeping over a bandwidth of more than 15%, whereas in certain applications, it would be desirable for the VCO to be capable of covering a bandwidth of more than 40% while still retaining good spectrum quality.

The invention seeks to remedy this drawback. To this end, the invention provides a voltage controlled microwave oscillator (VCO), said VCO including an active device such as a transistor, etc., which is adjusted to be potentially unstable in a determined frequency band, and a tuning circuit whose phase needs to be adjusted in order to compensate the phase of the active circuit, said tuning circuit including at least one parallel resonant circuit which is constituted by putting an adjustment capacitance and a varactor in parallel, the assembly constituted by said varactor and its housing being intended to operate normally at frequencies which are considerably lower than those of the VCO.

The invention will be well understood, and its advantages and other characteristics will appear on reading the following description of a non-limiting embodiment applied to a two-slope VCO, the description being given with reference to the sole accompanying figure which is an electrical circuit diagram of said two-slope VCO.

With reference to this sole figure, reference 1 designates the active device of the oscillator, said active device being conventionally constituted, for example, by a bipolar transistor fed with a voltage ($-V$) between a terminal 2 and ground, and in entirely conventional manner being biased so as to be potentially unstable in the band of oscillation frequencies under consideration. The output from the oscillator is taken from terminal 3.

In conventional manner, oscillation occurs if the phase of the tuning circuit applied to the active circuit 1 (e.g. the base of a bipolar transistor) via a coupling capacitance 5 compensates the phase of the active circuit 1.

The tuning circuit 4 is constituted by two circuits connected in series, comprising a steep slope coarse tuning circuit 6 and a gentle slope fine tuning circuit 7.

The fine tuning circuit 7 comprises a conventional varactor 8 connected in parallel with a capacitor 9 whose capacitance is of the same order of magnitude as that of the varactor 8, thereby, in conventional manner, reducing the ratio of maximum capacitance to minimum capacitance across the terminals of the varactor 8, and consequently reducing the sensitivity of the VCO to its fine tuning control.

The fine tuning control voltage ($+Vf$) is applied via a resistor 10 and a high impedance transmission line 11 to the point where the capacitances 9 and 5 are interconnected. Fine tuning control current returns to ground via another high impedance transmission line 12. A capacitor 33 decouples very high frequencies from the fine tuning control voltage Vf.

The transmission line 12 does not merely serve to ground the control current. It is interchangeable and thus adjustable in length: by adjusting its length, it is possible to modify the total phase variation of the tuning circuit obtained by causing the fine tuning control voltage Vf to vary over a given range, thereby making it possible to adjust the sensitivity of the VCO to its fine tuning control.

The coarse tuning circuit 6 is constituted by the series connection of three varactors 13, 14, and 15, with a small value adjustable capacitance 16 being connected in parallel with the varactor 13 and an adjustable capacitance 17 providing the connection to the fine tuning circuit 7. The coarse tuning control voltage ($-Vc$) is applied to the point interconnecting the varactors 13 and 14, and to the point connecting the varactor 15 with the adjustable capacitance 17. Control current flows through a bias resistance 18, and a high impedance transmission line 19 to the pair of varactors 13 and 14, and via a high impedance transmission line 20 to the varactor 15, and it returns to ground via a third high impedance transmission line 21. Capacitances 22 to 24 are connected between the junction points between the components 18 to 20 and ground, thereby decoupling high frequencies from the coarse tuning control voltage ($-Vc$).

The varactors 13, 14, and 15, and in particular the varactor 13 are most unusual: these varactors, together with the housings containing them, are varactors which are normally intended to operate at frequencies that are considerably lower than the frequencies of the VCO. By way of numerical example, if the oscillator is intended to operate in the 2 Gigahertz band, then the varactors 13 to 15 in their housings should normally be intended to operate around 400 MHz to 500 MHz. By making these varactors operate at frequencies which are considerably higher than those for which they were constructed, parasitic inductances intrinsic to the housings dominate: from the microwave point of view, they appear to be inductances and not capacitances.

Under these conditions, connecting the small value capacitance 16 in parallel with the "inductive" varactor 13 causes parallel resonance to occur at this point, thereby giving rise to large changes in phase of the tuning circuit 6 as a function of frequency due to the properties of resonant circuits, and consequently considerably widening the VCO bandwidth obtained by the coarse tuning circuit 6. Connecting the three varactors 13 to 15 in series further increases this bandwidth and as a result it may achieve a value considerably greater than 40%.

The value of the total capacitance of the coarse tuning circuit 6 determines the frequency at which the VCO oscillates. This value is adjusted by the variable capacitance 17 connected in series with the varactors 13 to 15.

Finally, there are three ways in which the VCO may be adjusted:

its bandwidth may be adjusted by adjusting the value of the capacitance 16;

its central oscillation frequency may be adjusted by adjusting the value of its capacitance 17; and its sensitivity to its fine tuning control may be adjusted by adjusting the length of the transmission line 12.

Naturally, the invention is not limited to the embodiment described above. Thus, the adjustable capacitance 17 could be replaced by another varactor, which would lead to four varactors being connected in series in the coarse tuning circuit 6. The varactors 14 and 15 could be "ordinary" varactors, i.e. designed to operate at the oscillation frequency band of the VCO. In contrast, the varactor 8 could also be of the same "special" type as the varactor 13, in which case the capacitance 9 would no longer have the above-mentioned utility. The polarities of the control voltages Vc and Vf could be inverted, providing corresponding inversions are made to each of the varactors in the corresponding circuits, etc.

I claim:

1. A voltage controlled microwave oscillator, said oscillator comprising an active circuit (1) including a transistor or the like, which is adjusted to be potentially unstable in a determined frequency band, and at least one tuning circuit (4) whose phase must be adjusted to compensate the phase of the active circuit (1), the oscillator being characterized in that the tuning circuit (4) includes at least one parallel resonant circuit (13, 16) constituted by an adjusting capacitance (16) and a varactor (13) connected in parallel, the assembly constituted by said varactor (13) and its housing being designed to operate normally at frequencies considerably less than the frequencies of the oscillator such that, at the operating frequencies of the oscillator, said assembly behaves as an inductance and not as a capacitance, by virtue of the parasitic inductances intrinsic to the housing of said varactor (13) dominating.

2. A voltage controlled microwave oscillator according to claim 1, characterized in that it includes, connected in series between the varactor (13) and the active circuit (1), a variable capacitance (17) suitable for adjusting the central frequency of oscillation of said oscillator.

3. A voltage controlled microwave oscillator according to claim 2, characterized in that said variable capacitance (17) is constituted by another varactor.

4. A voltage controlled microwave oscillator according to claim 1, characterized in that it includes two other varactors (14, 15) connected in series with the first varactor (13) and controlled by the same control voltage (−Vc).

5. A microwave oscillator according to claim 4, characterized in that said two other varactors (14, 15) together with their housings, are also designed to operate at frequencies considerably lower than the operating frequencies of said oscillator.

6. A microwave oscillator according to claim 1, said oscillator further including a fine tuning control circuit (7) suitable for fine adjustment of its frequency of oscillation, the oscillator being characterized in that said fine tuning control circuit (7) includes a transmission line (12) for returning its control current to ground, which transmission line is adjustable so as to adjust the sensitivity of the oscillator to its fine tuning control.

* * * * *